United States Patent
Jang et al.

(10) Patent No.: US 7,141,851 B2
(45) Date of Patent: Nov. 28, 2006

(54) TRANSISTORS HAVING A RECESSED CHANNEL REGION

(75) Inventors: Young-Chul Jang, Gyeonggi-do (KR); Sung-Bong Kim, Gyeonggi-do (KR); Hoon Lim, Seoul (KR); Soon-Moon Jung, Gyeonggi-do (KR)

(73) Assignee: Samsung Electronics Co., Ltd., (KR)

( * ) Notice: Subject to any disclaimer, the term of this patent is extended or adjusted under 35 U.S.C. 154(b) by 0 days.

(21) Appl. No.: 10/922,344

(22) Filed: Aug. 20, 2004

(65) Prior Publication Data

US 2005/0040475 A1    Feb. 24, 2005

(30) Foreign Application Priority Data

Aug. 22, 2003  (KR) .......................... 10-2003-58434
Sep. 29, 2003  (KR) .......................... 10-2003-67362

(51) Int. Cl.
*H01L 29/78*   (2006.01)
(52) U.S. Cl. .................. 257/330; 257/332; 257/334
(58) Field of Classification Search ........... 257/330, 257/332, 334
See application file for complete search history.

(56) References Cited

U.S. PATENT DOCUMENTS

| | | | | |
|---|---|---|---|---|
| 5,747,356 A | * | 5/1998 | Lee et al. .................... | 438/282 |
| 6,222,230 B1 | * | 4/2001 | Gardner et al. ............. | 257/329 |
| 6,358,800 B1 | * | 3/2002 | Tseng .......................... | 438/268 |
| 6,465,842 B1 | * | 10/2002 | Nishinohara ................. | 257/330 |
| 6,566,198 B1 | * | 5/2003 | Park et al. ................... | 438/259 |
| 6,716,046 B1 | * | 4/2004 | Mistry ......................... | 439/270 |
| 6,815,297 B1 | * | 11/2004 | Krivokapic et al. ........ | 438/287 |

* cited by examiner

*Primary Examiner*—T. N. Quach
(74) *Attorney, Agent, or Firm*—Myers Bigel Sibley & Sajovec, P.A.

(57) ABSTRACT

A transistor includes a substrate and a device isolation layer that is formed on the substrate to define an active region. A gate pattern crosses over the active region. A gate insulation layer is interposed between the gate pattern and the active region. Source and drain regions are formed in the active region adjacent to respective sides of the gate pattern. A channel region is disposed in the active region between the source and drain regions. The channel region includes a recessed portion.

13 Claims, 18 Drawing Sheets

TRANSISTORS HAVING A RECESSED CHANNEL REGION

RELATED APPLICATION

This application claims the benefit of and priority to Korean Patent Application No. 2003-58434, filed Aug. 22, 2003, and Korean Patent Application No. 2003-67362, filed Sep. 29, 2003, the disclosures of which are hereby incorporated herein by reference as if set forth in their entireties.

BACKGROUND OF THE INVENTION

The present invention relates generally to integrated circuit devices and fabrication methods therefor, and, more particularly, to transistors having a suppressed short channel effect and fabrication methods therefor.

With the recent trend toward finer semiconductor devices, the 2-dimensonal size of transistors has become generally smaller. Reduction in channel length and width of a transistor, however, may be problematic. Moreover, these problems may be more severe in nano-scale transistors.

If the channel length is reduced, the threshold voltage may be reduced, which may increase the response speed of the device. Unfortunately, punchthrough may occur, leakage current may increase due to the surface punchthrough and the lower threshold voltage, and a sub-threshold swing may deteriorate. That is, the short channel effect may degrade a switching characteristic of the transistor.

If the channel width is reduced, the driving current may decrease, which may reduce the operation speed of the transistor. Further, narrow-width effects may be intensified. Due to the above problems, it may be difficult to reduce the width of transistors so as to improve the operation speed of a device in a high performance SRAM. Moreover, it may be difficult to increase the integration density in such devices.

SUMMARY OF THE INVENTION

According to some embodiments of the present invention, a transistor includes a substrate and a device isolation that is formed on the substrate to define an active region. A gate pattern crosses over the active region. A gate insulation layer is interposed between the gate pattern and the active region. Source and drain regions are formed in the active region adjacent to respective sides of the gate pattern. A channel region is disposed in the active region between the source and drain regions. The channel region includes a recessed portion.

In other embodiments, a bottom portion of the gate pattern projects toward the recessed portion of the channel region.

In still other embodiments, a surface of the recessed portion of the channel region is inclined.

In further embodiments of the present invention, a transistor includes a substrate and a device isolation layer that is formed on the substrate to define an active region. A gate pattern crosses over the active region. A gate insulation layer is interposed between the gate pattern and the active region. Source and drain regions are formed in the active region adjacent to respective sides of the gate pattern. A channel region is disposed in the active region between the source and drain regions. A recess region is disposed in the active region beneath the gate pattern. The recess region is spaced apart from edges of the device isolation layer and edges of the gate pattern such that the gate pattern overlaps the recess region.

In other embodiments, a width of the recess region is less than a width of the active region in a direction parallel with the gate pattern and is less than a width of the gate pattern in a direction perpendicular to the gate pattern.

In still other embodiments, a bottom portion of the gate pattern projects toward the recess region.

In still other embodiments, a surface of the channel region is inclined along a surface of the recess region.

In further embodiments of the present invention, a transistor includes a substrate and a device isolation layer formed on the substrate to define an active region. A device isolation layer is formed on the substrate to define an active region. A gate pattern crosses over the active region. A first trench is formed in the active region and a recess region is formed in the first trench below the gate pattern. A gate insulation layer is interposed between the gate pattern and the active region. Source and drain regions are formed in the active region adjacent to respective sides of the gate pattern. A channel region is disposed in the active region between the source and drain regions.

In other embodiments, a boundary of the first trench is spaced from a boundary of the device isolation layer.

In still other embodiments, a width of the first trench is less than a width of the active region.

In still other embodiments, a width of the recess region is less than a width of the active region in a direction parallel with the gate pattern and is less than a width of the gate pattern in a direction perpendicular to the gate pattern.

In still other embodiments, a bottom portion of the gate pattern projects toward the recess region, and a surface of the channel region is inclined along a surface of the recess region.

In still other embodiments, a second trench is formed in the active region below the gate pattern. The recess region is formed at an intersection of the first and second trenches.

In still other embodiments, a boundary of the first trench is spaced from a boundary of the device isolation layer.

In still other embodiments, the first and second trenches intersect at a bottom portion of the gate pattern.

In still other embodiments, a width of the first trench is less than a width of the active region, and a width of the second trench is less than a width of the gate pattern.

In still other embodiments, a bottom portion of the gate pattern projects toward the recess region, and a surface of the channel region is inclined along a surface of the recess region.

Although the present invention has been described above primarily with respect to transistor device embodiments, it will be understood that the present invention may also be embodied as methods of fabricating a transistor device.

BRIEF DESCRIPTION OF THE DRAWINGS

Other features of the present invention will be more readily understood from the following detailed description of specific embodiments thereof when read in conjunction with the accompanying drawings, in which.

DETAILED DESCRIPTION OF PREFERRED EMBODIMENTS

Figure 1A:
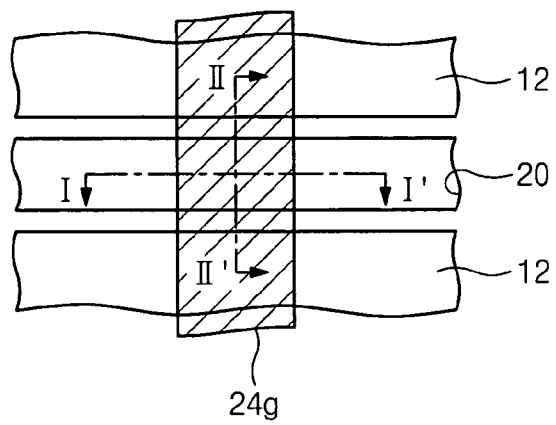
FIG. 1A is a top plan view of a recess channel transistor according to some embodiments of the present invention.

While the invention is susceptible to various modifications and alternative forms, specific embodiments thereof are shown by way of example in the drawings and will herein be described in detail. It should be understood, however, that there is no intent to limit the invention to the particular forms disclosed, but on the contrary, the invention is to cover all modifications, equivalents, and alternatives falling within the spirit and scope of the invention as defined by the claims. Like numbers refer to like elements throughout the description of the figures. In the figures, the dimensions of layers and regions are exaggerated for clarity. Each embodiment described herein also includes its complementary conductivity type embodiment.

It will be understood that when an element such as a layer, region or substrate is referred to as being "on" another element, it can be directly on the other element or intervening elements may also be present. It will be understood that if part of an element, such as a surface, is referred to as "inner," it is farther from the outside of the device than other parts of the element. Furthermore, relative terms such as "beneath" or "overlies" may be used herein to describe a relationship of one layer or region to another layer or region relative to a substrate or base layer as illustrated in the figures. It will be understood that these terms are intended to encompass different orientations of the device in addition to the orientation depicted in the figures. Finally, the term "directly" means that there are no intervening elements. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first region, layer or section discussed below could be termed a second region, layer or section, and, similarly, a second region, layer or section could be termed a first region, layer or section without departing from the teachings of the present invention.

Figure 1B:
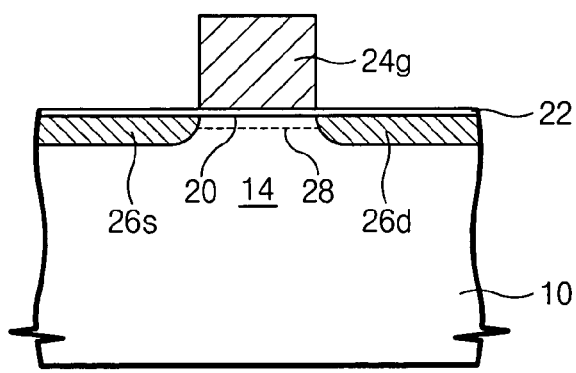
FIG. 1B is a cross-sectional view taken along a line I–I' of FIG. 1A.
Figure 1C:
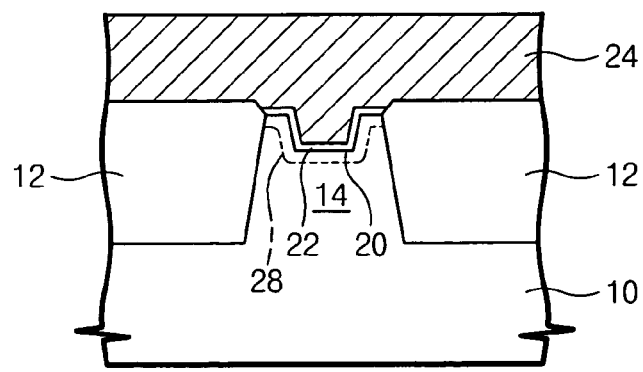
FIG. 1C is a cross-sectional view taken along a line II–II' of FIG. 1A.

A recess channel transistor according to some embodiments of the present invention will now be described with reference to FIG. 1A, FIG. 1B, and FIG. 1C. Referring now to FIG. 1A, FIG. 1B, and FIG. 1C, a recess channel transistor includes a substrate 10 and a device isolation layer formed on the substrate 10 to define an active region 10. A gate pattern 24g crosses over the active region. A recess region 20 is formed at the active region 14 below the gate pattern 24g. Therefore, a bottom of the gate pattern 24g projects toward the recess region 20. In one direction, the recess region 20 has a boundary spaced apart from device isolation layers 12 disposed at both sides of the recess region 20. A gate insulation layer 22 is interposed between the gate pattern 24g and the active region 14. A source region 26s and a drain region 26d are formed in an active region adjacent to opposite sides of the gate pattern 24g. A channel region 28 is defined at an active region between the source region 26s and the drain region 26d. Because the channel region 28 is recessed along the recess region 20, a channel width may increase. That is, because the channel width may increase more than the sizes of the gate pattern and the active region, it may be possible to reduce the decrease in current caused by a reduction in the transistor size.

Figure 2A:
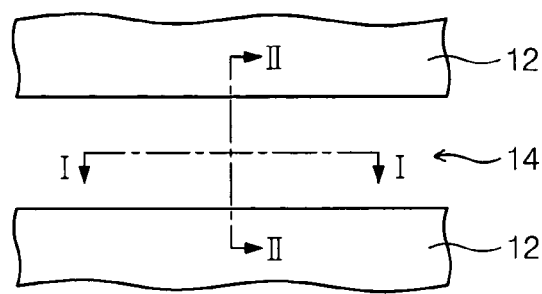
FIG. 2A and FIG. 3A are top plan views that illustrate methods of fabricating a recess channel transistor according to some embodiments of the present invention.
Figure 2B:
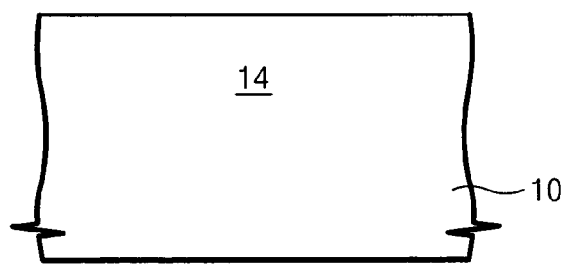
FIG. 2B and FIG. 3B are cross-sectional views taken along a line I–I' of FIG. 2A and FIG. 3A, respectively.
Figure 2C:
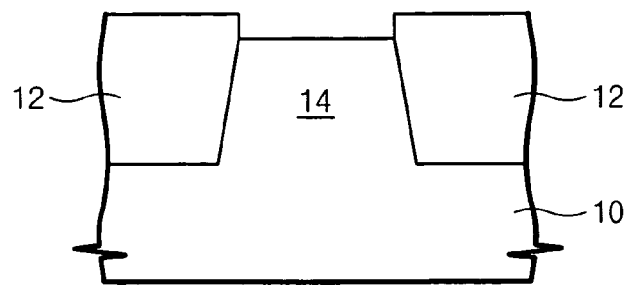
FIG. 2C and FIG. 3C are cross-sectional views taken along a line II–II' of FIG. 2A and FIG. 3A, respectively.

A method of fabricating a recess channel transistor according to some embodiments of the invention will now be described with reference to FIG. 2A through FIG. 3C. Referring now to FIG. 2A, FIG. 2B, and FIG. 2C, a device isolation layer 12 is formed on a substrate 10 to define an active region. The device isolation layer 12 may be formed using shallow trench isolation (STI). The substrate 10 may be a silicon substrate or silicon-germanium substrate in accordance with various embodiments of the present invention. The device isolation layer 12 is formed to have a sidewall that is opposite to the active region 14.

Figure 3A:
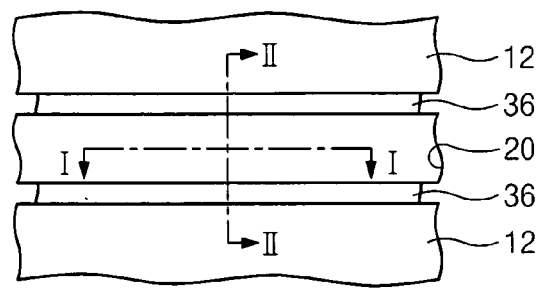
Figure 3B:
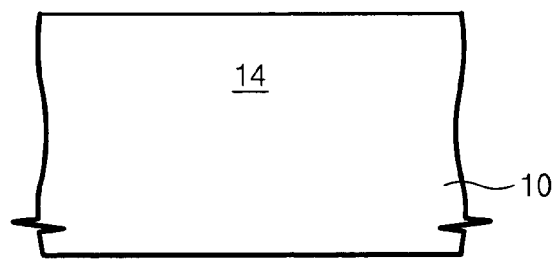
Figure 3C:
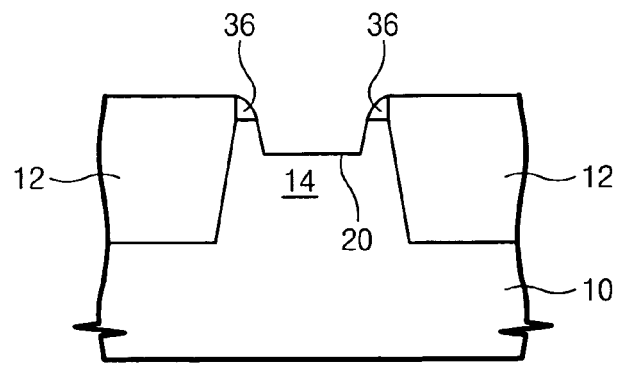

Referring now to FIG. 3A, FIG. 3B, and FIG. 3C, a spacer insulation layer is conformally formed on the surface of the substrate 10 where the device isolation layer 12 is formed. The spacer insulation layer may comprise a material having an etch selectivity with respect to the substrate 10 and the device isolation layer 12. Namely, the spacer insulation layer may comprise, for example, silicon nitride. The spacer insulation layer is anisotropically etched to form a spacer insulation pattern 16 on a sidewall of the device isolation layer that is opposite to the active region 14. Using the spacer insulation pattern 16 and the device isolation layer 12 as an etch mask, the substrate 10 is etched to form a recess region 20 that is substantially parallel with the active region 14.

Although not shown in FIGS. 3A through 3C, a gate insulation layer 22 is formed on the surface of the substrate 10 and a gate pattern 24g is formed to cross over the active region 14. Thus, a semiconductor device as shown in FIG. 1A, FIG. 1B, and FIG. 1C may be fabricated.

Figure 4A:
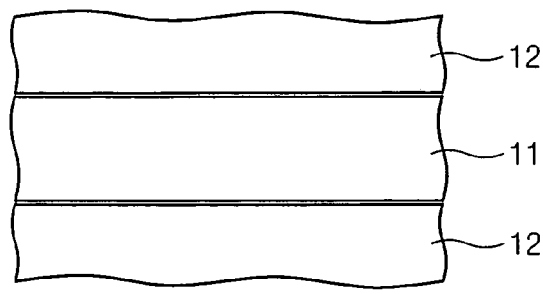
FIG. 4A and FIG. 5A are top plan views that illustrate methods of fabricating a recess channel transistor according to further embodiments of the present invention.
Figure 4B:
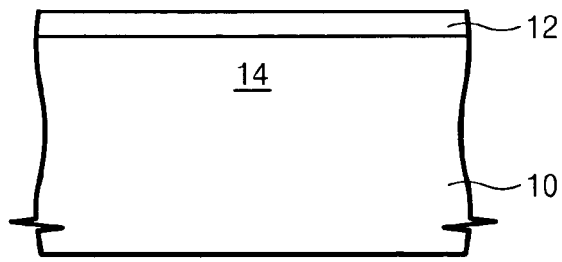
FIG. 4B and FIG. 5B are cross-sectional views taken along a line III–III' of FIG. 4A and FIG. 5A, respectively.
Figure 4C:
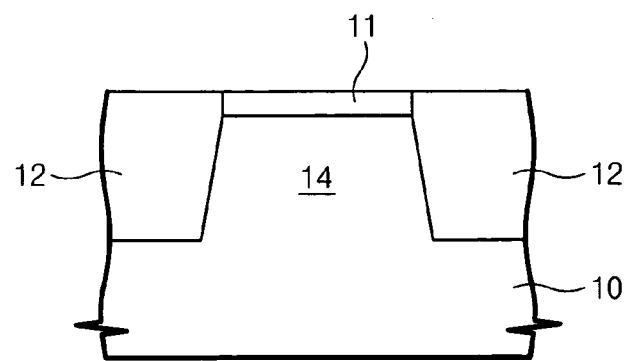
FIG. 4C and FIG. 5C are cross-sectional views taken along a line IV–IV' of FIG. 4A and FIG. 5A, respectively.

A method of fabricating a recess channel transistor according to further embodiments of the present invention will now be described with reference to FIG. 4A through FIG. 5C. Referring now to FIG. 4A, FIG. 4B, and FIG. 4C, a hard mask pattern 11 is formed on a substrate 10. Using the hard mask pattern 11 as an etch mask, the substrate 10 is etched to form a trench. A device isolation layer 12 filled in the trench is formed. The substrate 10 may be a silicon substrate or a silicon-germanium substrate in accordance with various embodiments of the present invention.

Figure 5A:
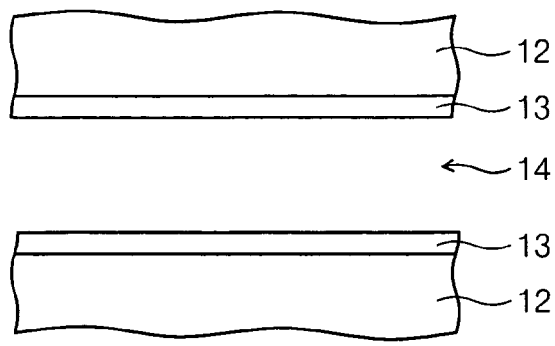
Figure 5B:
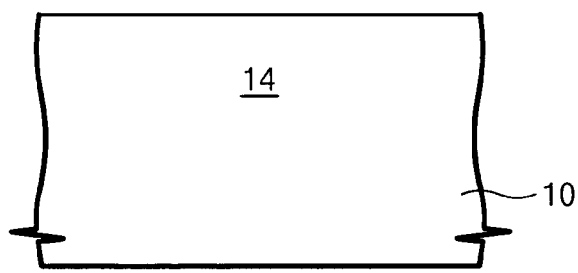
Figure 5C:
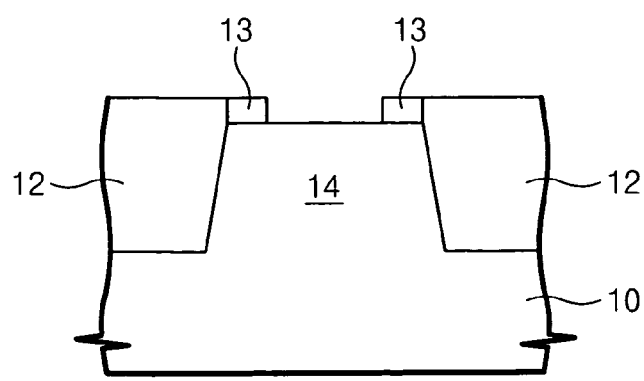

Referring now to FIG. 5A, FIG. 5B, and FIG. 5C, the hard mask pattern 11 is etched to expose a central portion of the active region and to form an insulation pattern 13 on a sidewall of a device isolation layer that is opposite to the active region 14. The hard mask pattern 11 may be etched using a photolithographic process. In this case, a photoresist pattern is formed at the central portion of the active region to have an opening that exposes the hard mask pattern 11 in parallel with the active region. Using the photoresist pattern as an etch mask, the hard mask pattern 11 is etched to expose the active region 14 and to form an insulation pattern 13 at the edge of the active region 14.

Using the insulation pattern 13 and the device isolation layer 12 as an etch mask, the substrate 10 is etched to form a recess region defined at the central portion of the active region in parallel with the active region. Although not shown in FIGS. 5A through 5C, a gate pattern 24g is formed on the gate insulation layer 22 to cross over the active region.

Figure 6A:
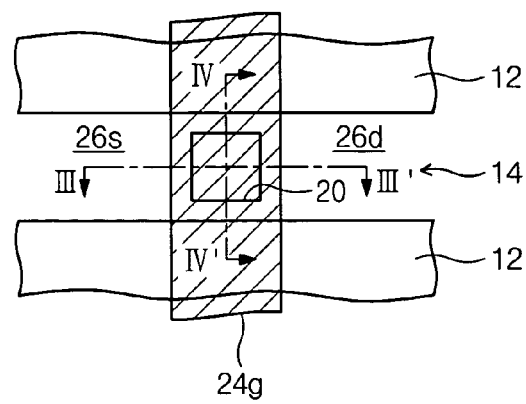
FIG. 6A is a top plan view of a recess channel transistor according to further embodiments of the present invention.
Figure 6B:
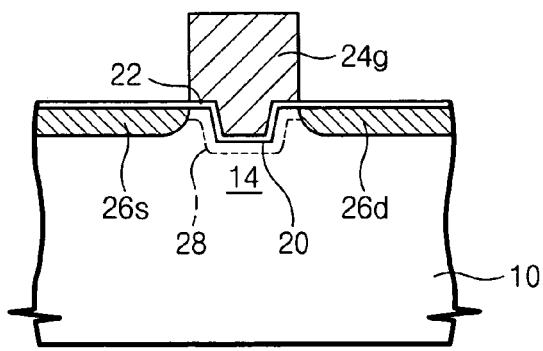
FIG. 6B is a cross-sectional view taken along a line III–III' of FIG. 6A.
Figure 6C:
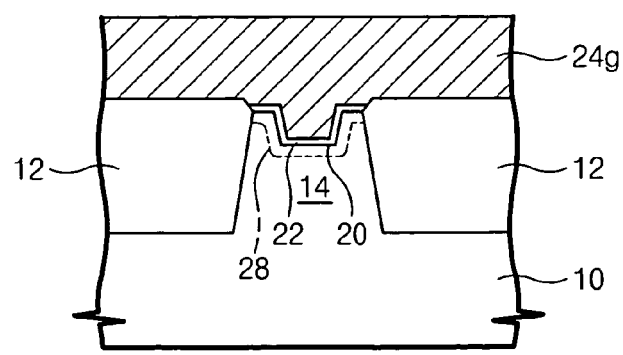
FIG. 6C is a cross-sectional view taken along a line IV–IV' of FIG. 6A.

A recess channel transistor according to further embodiments of the present invention will now be described with reference to FIG. 6A, FIG. 6B, and FIG. 6C. Referring now to FIG. 6A, FIG. 6B, and FIG. 6C, a recess channel transistor includes a substrate 10 and a device isolation layer 12 that is formed on the substrate to define an active region 14. A gate pattern 24g crosses over the active region 14. A recess region 20 is formed at the active region 14 below the gate pattern 24g. Therefore, a bottom of the gate pattern 24g projects toward the recess region 20. In one direction, the recess region 20 has a boundary spaced apart from device isolation layers 12 disposed at both sides of the recess region 20. A gate insulation layer 22 is interposed between the gate pattern 24g and the active region 14. A source region 26s and a drain region 26d are formed in an active region adjacent to opposite sides of the gate pattern 24g. A channel region 28 is defined at an active region between the source region 26s and the drain region 26d. Because the channel region 28 is recessed along the recess region 20, a channel length and a channel width may increase. That is, because the channel width may increase more than the sizes of the gate pattern and the active region, it may be possible to reduce a decrease in current and a short channel effect caused by a reduction in the size of the transistor. The width of the recess region 20 is smaller than that of the gate pattern 24g in a vertical direction to the gate pattern 24g, and is smaller than that of the active region 14 in a parallel direction with the gate pattern 24g.

Figure 7A:
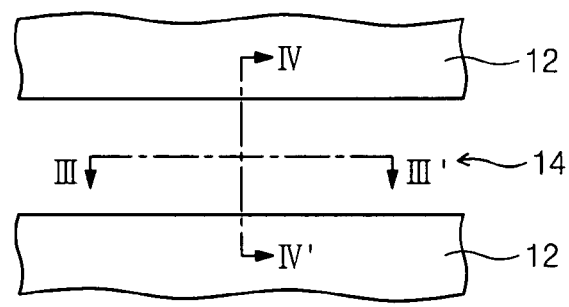
FIG. 7A, FIG. 8A, and FIG. 9A are top plan views that illustrate a recess channel transistor according to further embodiments of the present invention.
Figure 7B:
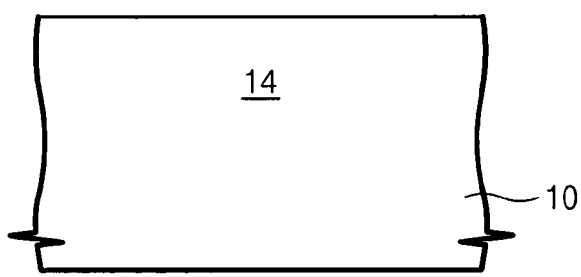
FIG. 7B, FIG. 8B, and FIG. 9B are cross-sectional views taken along a line III–III' of FIG. 9A.
Figure 7C:
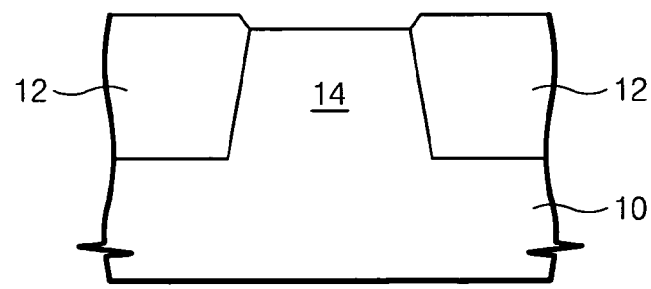
FIG. 7C, FIG. 8C, and FIG. 9C are cross-sectional views taken along a line IV–IV' of FIG. 9A.

A method of fabricating a recess channel transistor according to further embodiments of the invention will now be described with reference to FIG. 7A through FIG. 9C. Referring now to FIG. 7A, FIG. 7B, and FIG. 7C, a device isolation layer 12 is formed on a substrate 10 to define an active region 14. The device isolation layer 12 may be formed using shallow trench isolation (STI). The substrate 10 may be a silicon substrate or a silicon-germanium substrate in accordance with various embodiments of the present invention.

Figure 8A:
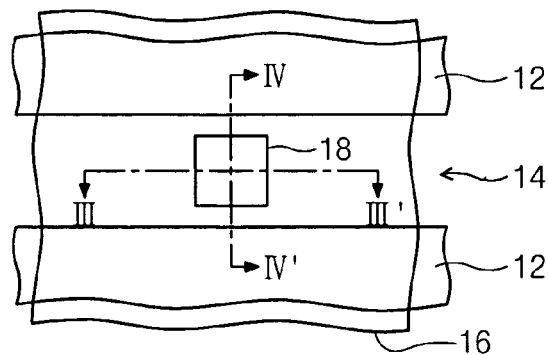
Figure 8B:
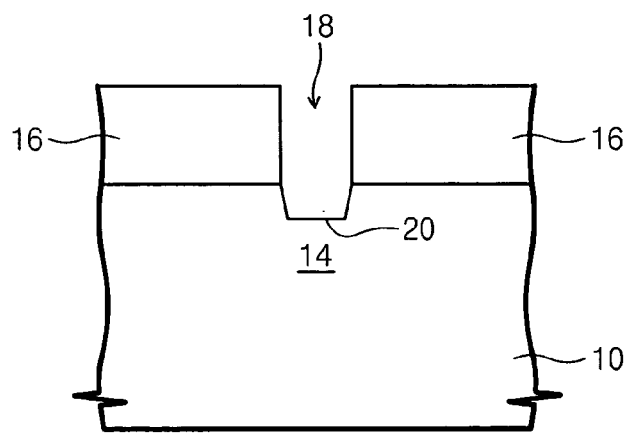
Figure 8C:
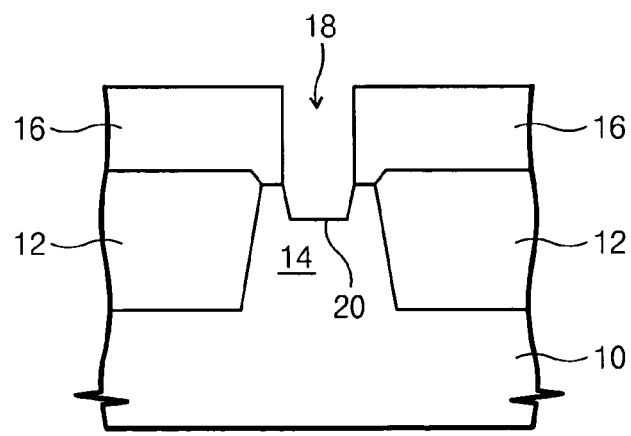

Referring now to FIG. 8A, FIG. 8B, and FIG. 8C, a mask pattern having an opening exposing a portion of the active region is formed on the substrate 10. A boundary of the opening 18 is spaced apart from a boundary of the device isolation layer 12. The mask pattern 16 may be made of a material having an etch selectivity with respect to the substrate 10 and the device isolation layer 12. Namely, the mask pattern 16 may be made of, for example, silicon nitride, metallic oxide, photoresist, and combinations thereof. Using the mask pattern 16 as an etch mask, the exposed portion of the substrate 10 is etched to form a recess region 20.

Figure 9A:
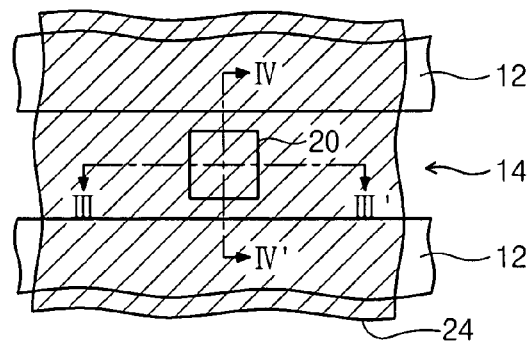
Figure 9B:
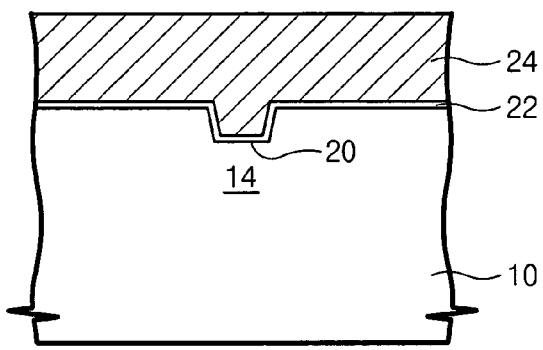
Figure 9C:
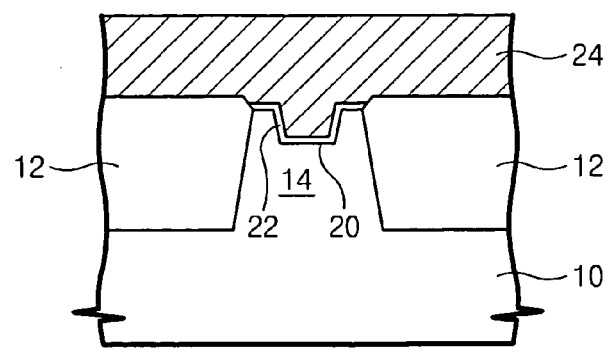

Referring now to FIG. 9A, FIG. 9B, and FIG. 9C, the mask pattern 16 is removed. The substrate 10 is thermally oxidized to cure a substrate defect occurring during formation of the recess region 20. In this case, a thermal oxide layer formed on the substrate 10 is removed and cleaned to make a boundary of the recess region 20 substantially round.

A gate insulation layer 22 is formed on the surface of an active region including the recess region 20. The gate insulation layer 22 may comprise silicon oxide, metallic oxide, and/or silicon oxynitride. The gate insulation layer 22 may be formed by thermal oxidation, chemical vapor deposition (CVD) or atomic layer deposition (ALD) in accordance with various embodiments of the present invention. A channel diffusion layer may be further formed by implanting impurities into the active region 14. The channel diffusion layer may be formed before or after formation of the gate insulation layer 22. A conductive layer 24 is formed on the gate insulation layer 22. The conductive layer 24 may comprise polysilicon or polysilicon germanium. In other embodiments of the present invention, the conductive layer 24 may comprise metal (or metallic silicide) stacked on polysilicon (or polysilicon germanium).

The conductive layer 24 is patterned to form a gate pattern 24g crossing over the active region, as shown in FIG. 1A, FIG. 1B, and FIG. 1C. Using the gate pattern 24g as an ion implantation mask, a source region 26s is formed in an active region adjacent to one side of the gate pattern 24g and a drain region 26d is formed in an active region adjacent to the other side thereof. The gate pattern 24g crosses over the recess region 20.

In some embodiments of the present invention, the recess region 20 is formed at an active region below a central portion of the gate pattern 24g. A boundary of the recess region 20 is spaced apart from an extension line of the sidewall of the gate pattern 24g and from the device isolation layer 12. Because the channel below the gate pattern 24g is inclined along a surface of the recess region 20, a channel length is longer than the width of the gate pattern and a channel width is wider than the width of the active region 14. Thus, although the transistor has about the same 2-dimensional size as a conventional transistor, the influence of a short channel effect may be lessened and driving current may be increased.

Figure 10A:
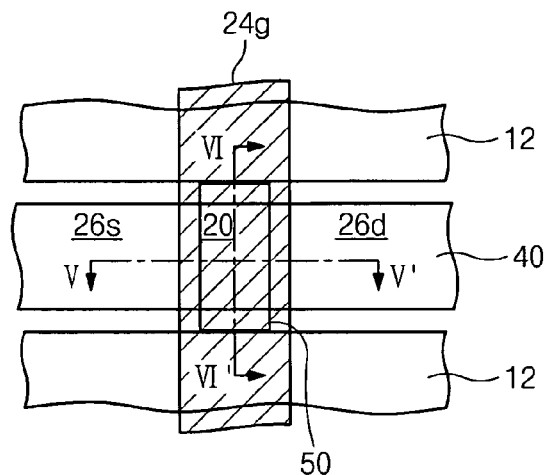
FIG. 10A is a top plan view of a recess channel transistor according to further embodiments of the present invention.
Figure 10B:
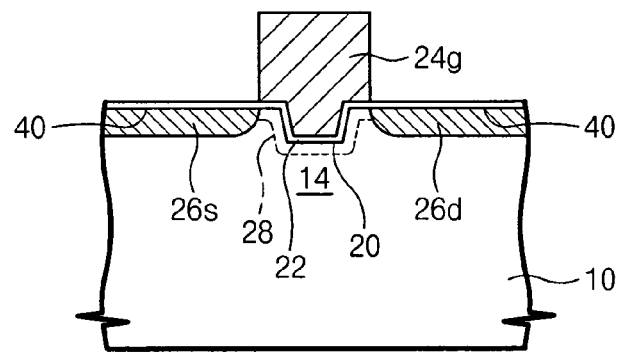
FIG. 10B is a cross-sectional view of the recess channel transistor, taken along a line V–V' of FIG. 10A.
Figure 10C:
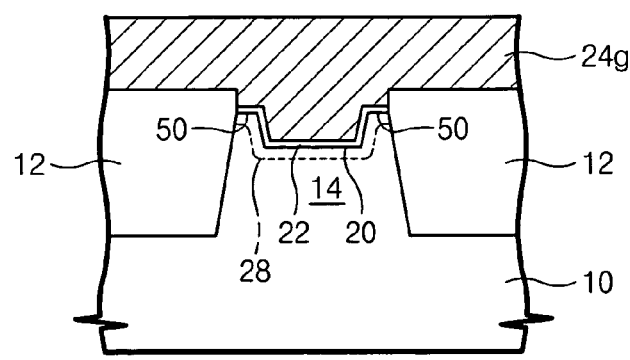
FIG. 10C is a cross-sectional view of the recess channel transistor, taken along a line VI–VI' of FIG. 10A.

A recess transistor in accordance with further embodiments of the present invention will now be described with reference to FIG. 10A, FIG. 10B, and FIG. 10C. Referring now to FIG. 10A, FIG. 10B, and FIG. 10C, a device isolation layer 12 is formed on a substrate 10 to define an active region 14. The active region 14 is disposed on the substrate 10 in one direction and includes a first trench 40 formed in the same direction as the active region 14. A boundary of the first trench 40 is spaced apart from the device isolation layer 12. The first trench 40 may be spaced from the device isolation layers 12 disposed at both sides thereof at the same interval. That is, a distance between one side of the first trench 40 and a central axis of the active region is approximately the same as a distance between the other side of the first trench 40 and the central axis of the active region. The active region 14 further includes a second trench 50 that intersects the first trench 40. A gate pattern 24g crosses over the active region 14. The second trench 50 is disposed beneath the gate pattern 24g and its interface is spaced apart from the extension line of the sidewall of the gate pattern 24g. A gate insulation layer 22 is interposed between the gate pattern 24g and the active region 14. A recess region 20 is formed at an intersection of the first trench 40 and the second trench 50. The recess region 20 is deeper than the first and second trenches 40 and 50. Thus, the recess region 20 has a boundary spaced apart from the side extending from the sidewall of the gate pattern 24g in one direction, and has a boundary spaced apart from the device isolation layer 12 in the other direction.

The gate pattern 24g has a flexure along the surfaces of the first trench 40, the second trench 50, and the recess region 20, which are disposed beneath the gate pattern 24g. Furthermore, the gate pattern 24g projects toward the recess region 20, the first trench 40, and the second trench 50. A source region 26s is formed in an active region adjacent to one side of the gate pattern 24g, and a drain region 26d is formed in an active region adjacent to the other side thereof. A channel region 28 is defined between the source region 26s and the drain region 26d. Thus the length, width, and surface area of the channel region 28 have greater values along the flexure of the active region below the gate pattern 24g than a conventional transistor.

Figure 11A:
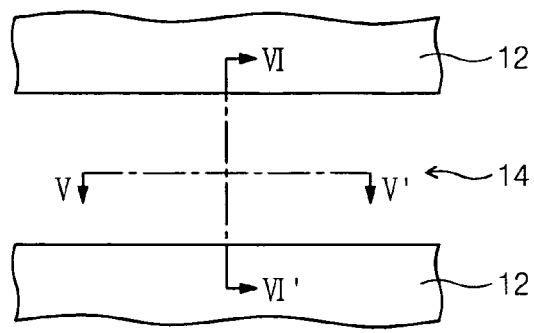
FIG. 11A, FIG. 12A, FIG. 13A, and FIG. 14A are top plan views that illustrate methods of fabricating a recess channel transistor according to further embodiments of the present invention.
Figure 11B:
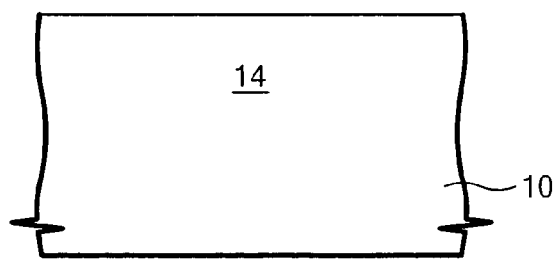
FIG. 11B, FIG. 12B, FIG. 13B, and FIG. 14B are cross-sectional views taken along a line V–V' of FIG. 11A, FIG. 12A, FIG. 13A, and FIG. 14A, respectively.
Figure 11C:
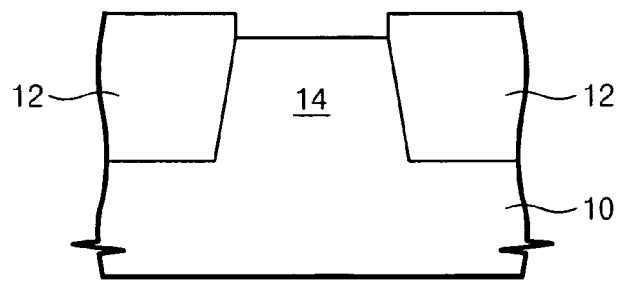
FIG. 11C, FIG. 12C, FIG. 13C, and FIG. 14C are cross-sectional views taken along a line VI–VI' of FIG. 11A, FIG. 12A, FIG. 13A, and FIG. 14A, respectively.

Methods for fabricating a recess channel transistor according to some embodiments of the present invention will now be described with reference to FIG. 11A through FIG. 14C. Referring now to FIG. 11A, FIG. 11B, and FIG. 11C, a device isolation layer 12 is formed on a substrate 10 to define an active region 14. The device isolation layer 12 may have a higher sidewall than the active region 14. The device isolation layer 12 may be formed using a shallow trench isolation (STI) technique. A hard mask pattern is formed on the substrate. Using the hard mask pattern as an etch mask, a trench region is formed. An insulation layer is formed on the surface of the substrate 10 to fill the trench region. Thereafter, a planarization process is carried out. If the hard mask pattern is removed, then a sidewall portion of the insulation layer is exposed to form a higher sidewall than the active region 14.

Figure 12A:
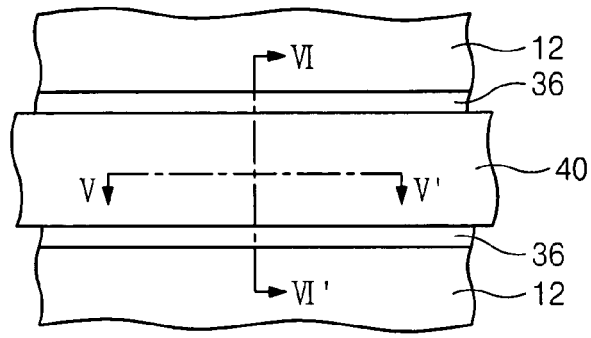
Figure 12B:
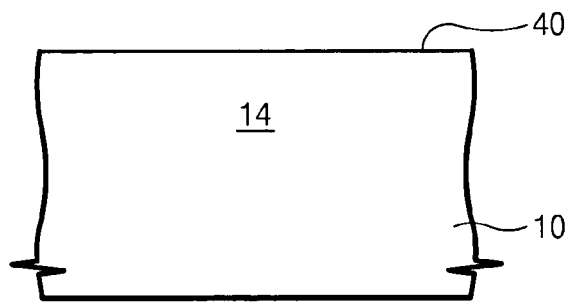
Figure 12C:
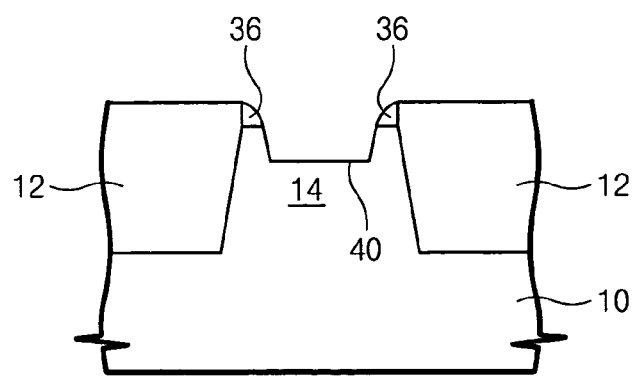

Referring now to FIG. 12A, FIG. 12B, and FIG. 12C, a spacer insulation layer is formed on the surface of the substrate including the device isolation layer 12. The spacer insulation layer is made of a material having an etch selectivity with respect to the substrate 10. That is, the spacer insulation layer may be made of silicon nitride or metallic oxide in accordance with various embodiments of the present invention. The spacer insulation layer is anisotropically etched to form a spacer pattern 36 on the sidewall of the device isolation layer 12. The spacer pattern 36 has a substantially uniform width along the boundary of the active region 14.

Using the spacer pattern 36 and the device isolation layer 12 as an etch mask, a portion of the active region 14 is etched. A first trench 40 is formed at the active region 14 to be spaced from the device isolation layer 12. The spaced distance is approximately equal to the width of the spacer pattern 36.

Figure 13A:
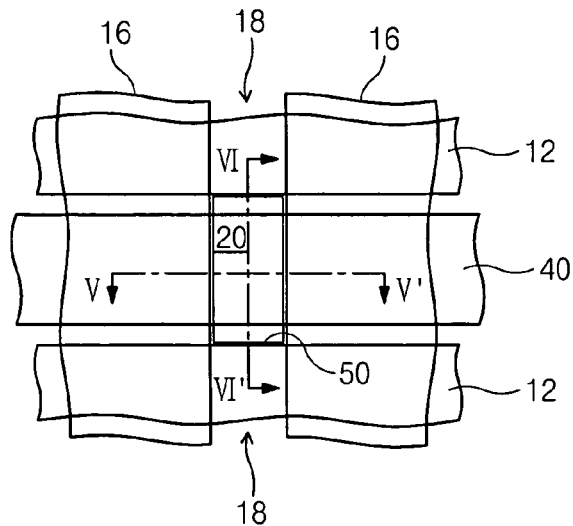
Figure 13B:
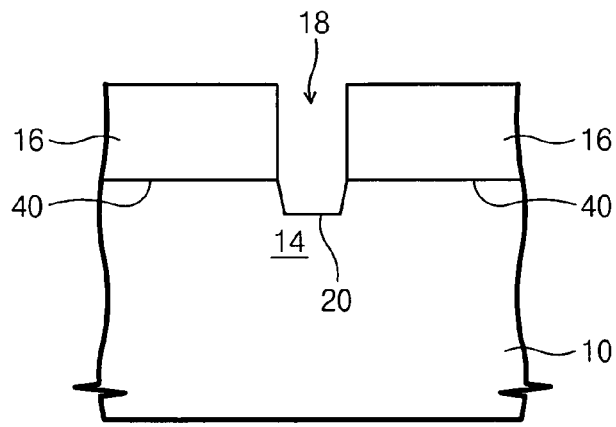
Figure 13C:
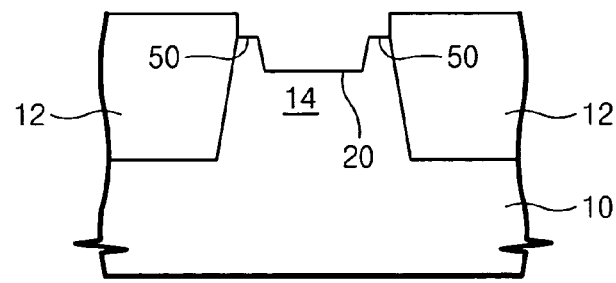

Referring to FIG. 13A, FIG. 13B, and FIG. 13C, the spacer pattern 36 is removed and a mask pattern 16 is formed over the substrate 10. The mask pattern 16 has an opening 18 crossing over the active region. A portion of the active region is exposed at the opening 18. The mask pattern 16 may be made of a material having an etch selectivity with respect to the device isolation layer 12 and the substrate 10. That is, the mask pattern 16 may comprise silicon nitride, metallic oxide, and/or photoresist. Using the mask pattern 16 as an etch mask, the exposed active region 14 is etched to form a second trench intersecting the first trench 40. A recess region 20 is formed at an intersection of the first trench 40 and the second trench 50. The recess region 20 is deeper than the first and second trenches 40 and 50.

Figure 14A:
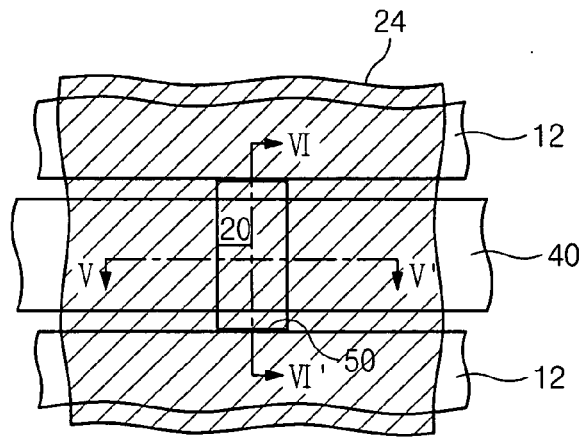
Figure 14B:
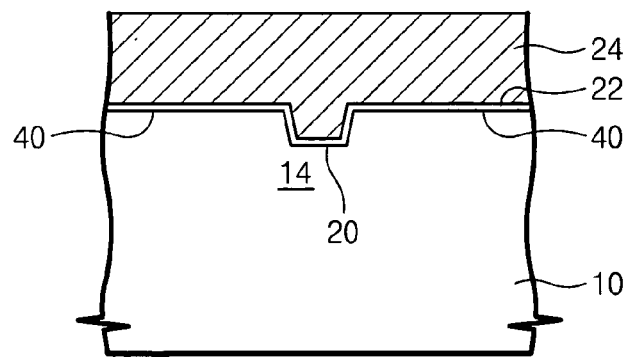
Figure 14C:
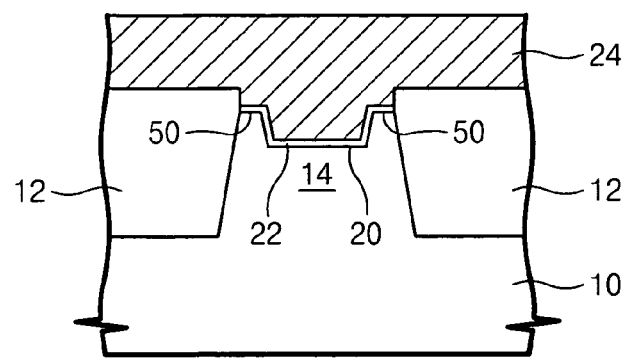

Referring to FIG. 14A, FIG. 14B, and FIG. 14C, the mask pattern 16 is removed. The substrate 10 is thermally oxidized to cure a defect that may occur during formation of the first and second trenches 40 and 50. In this case, a thermal oxide layer may be formed at a surface of the active region 14 by the thermal oxidation. The boundaries of the first trench 40, the second trench 50, and the recess region 20 may be rounded by removal of the thermal oxide layer and a cleaning process.

A gate insulation layer 22 is formed on an active region including the first trench 40, the second trench 50, and the recess region 20. A gate insulation layer 22 is formed on the surface of an active region 14 including the recess region 20. The gate insulation layer 22 may comprise silicon oxide, metallic oxide, and/or silicon oxynitride. Furthermore, the gate insulation layer 22 may be formed by thermal oxidation, chemical vapor deposition (CVD), or atomic layer deposition (ALD) in accordance with various embodiments of the present invention. A channel diffusion layer may be further formed by implanting impurities into the active region 14. The channel diffusion layer may be formed before or after formation of the gate insulation layer 22. A conductive layer 24 is formed on the gate insulation layer 22. The conductive layer 24 may comprise, for example, polysilicon or polysilicon germanium. Alternatively, in other embodiments of the present invention, the conductive layer 24 may comprise metal (or metallic silicide) stacked on polysilicon (or polysilicon germanium).

The conductive layer 24 is patterned to form a gate pattern 24g crossing over the active region 14 as shown in FIG. 5A, FIG. 5B, and FIG. 5C. Using the gate pattern 24g as an ion implantation mask, a source region 26s is formed in the active region adjacent to one side of the gate pattern 24g, and a drain region 26d is formed in the active region adjacent to the other side thereof. The gate pattern 24g crosses over the second trench 50 and the recess region 20. As shown in the figures, the recess region 20 may be disposed centrally below the gate pattern 24g.

In these embodiments, the recess region 20 may be formed in the active region centrally below the gate pattern 24g, which is an intersection of the first trench 40 and the second trench 50, and their interface is spaced apart from the extension line of the sidewall of the gate pattern 24g and the device isolation layer 12. Because a channel below the gate pattern 24g is curved along the surface of the recess region 20, the channel length is longer than the width of the gate pattern and the channel width is wider than the width of the active region 14. Thus, although the transistor may have about the same size as a conventional transistor, the influence of a short channel effect may be reduced and driving current may be increased.

Figure 15A:
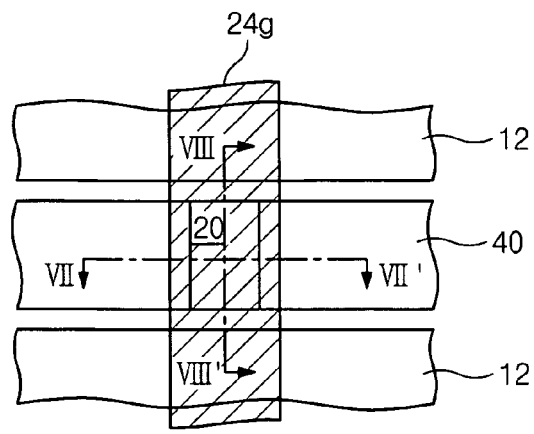
FIG. 15A is a top plan view of a recess channel transistor according to further embodiments of the present invention.
Figure 15B:
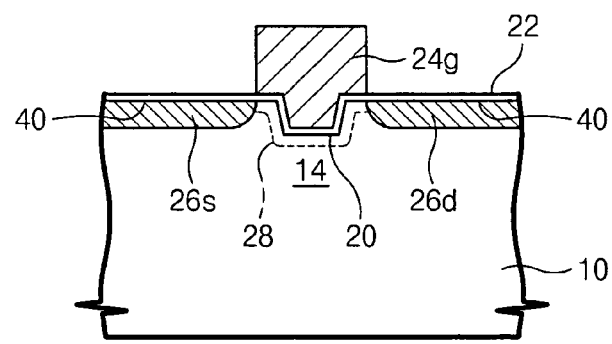
FIG. 15B is a cross-sectional view of the recess channel transistor, taken along a line VII–VII' of FIG. 15A.
Figure 15C:
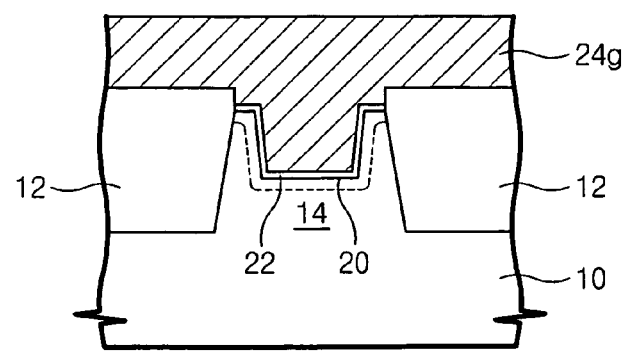
FIG. 15C is a cross-sectional view of the recess channel transistor, taken along a line VIII–VIII' of FIG. 15A.

A recess channel transistor according to further embodiments of the present invention will now be described with reference to FIG. 15A through FIG. 15C. Referring now to FIG. 15A, FIG. 15B, and FIG. 15C, a device isolation layer 12 is formed on a substrate 10 to define an active region 14. The active region 14 is defined in one direction of the substrate 10 and includes trenches 40 formed in the same direction. A boundary of the trench 40 is spaced apart from the device isolation layer 12. The trenches 40 are formed along a central axis, and their boundaries are disposed in the same direction from the both sides to the central axis. A gate pattern 24g crosses over the active region 14. A recess region 20 is deeper than the trench 40. The recess region 20 has a boundary spaced apart from the device isolation layer 12 in one direction and has a boundary spaced apart from the extension line of the sidewall of the gate pattern 24g in the other direction. A gate insulation layer 22 is interposed between the gate pattern 24g and the gate insulation layer 22. The gate pattern 24g has a bottom curved along the surfaces of the trench 40 and the recess region 20. More specifically, the gate pattern 24g projects toward the trench 40 and the recess region 20. A source region 26s is formed in the active region adjacent to one side of the gate pattern 24g, and a drain region 26d is formed in the active region adjacent to the other side thereof. A channel region 28 is defined between the source region 26s and the drain region 26d. The channel region 28 is inclined along the surface of the trench 40 and the recess region 20.

A step difference of the recess region 20 is larger in a parallel direction to the gate pattern 24g than in vertical direction to the gate pattern 24g. Therefore, a channel width of the transistor is relatively wider as compared to the embodiments described above.

Figure 16A:
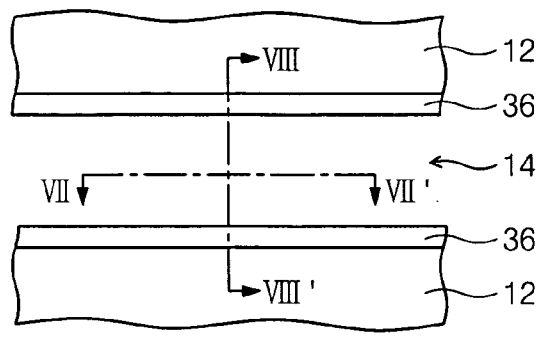
FIG. 16A, FIG. 17A, and FIG. 18A are top plan views that illustrate a recess channel transistor according to further embodiments of the present invention.
Figure 16B:
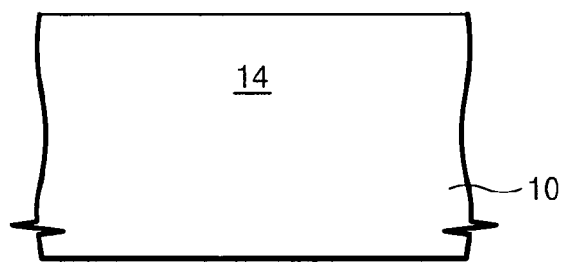
FIG. 16B, FIG. 17B, and FIG. 18B are cross-sectional views taken along a line VII–VII' of FIG. 16A, FIG. 17A, and FIG. 18A, respectively.
Figure 16C:
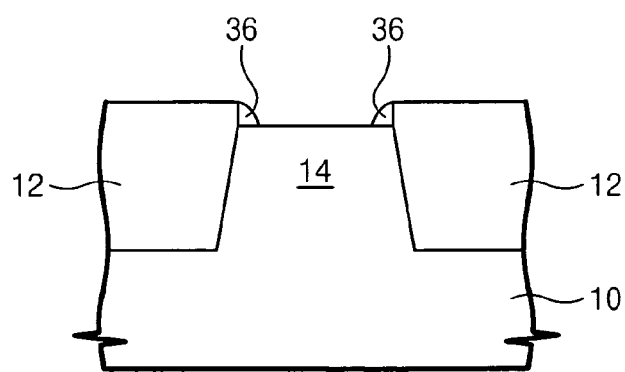
FIG. 16C, FIG. 17C, and FIG. 18C are cross-sectional views taken along a line VIII–VIII' of FIG. 16A, FIG. 17A, and FIG. 18A, respectively.

Methods of fabricating the recess channel transistor according to further embodiments of the invention will now be described with reference to FIG. 16A through FIG. 18C. Referring now to FIG. 16A, FIG. 16B, and FIG. 16C, a device isolation layer 12 is formed on a substrate 10 to define an active region 14. The device isolation layer 12 may be formed using a shallow trench isolation (STI) technique and may have a higher sidewall than the active region 14. A spacer pattern 36 is formed on a sidewall of the device isolation layer on the active region. The spacer pattern 36 may be formed in the same manner as discussed above. The spacer pattern 36 may comprise silicon nitride.

Figure 17A:
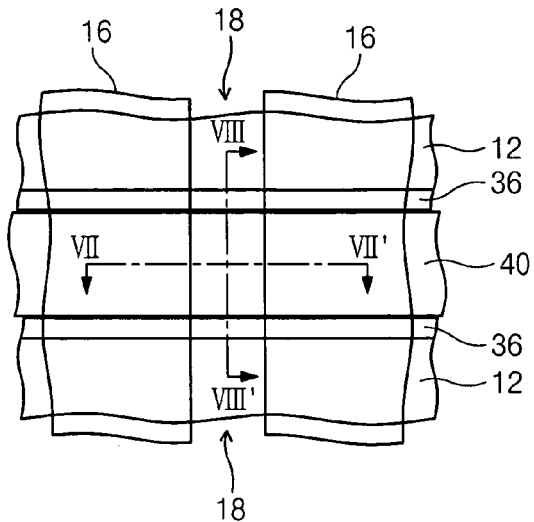
Figure 17B:
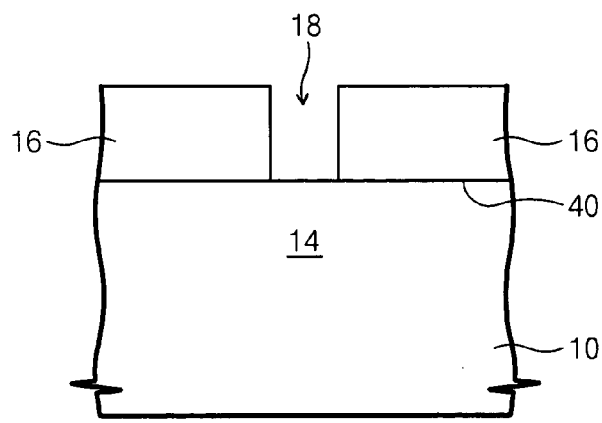
Figure 17C:
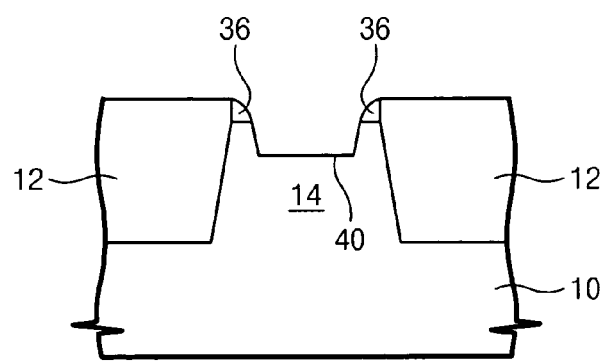

Referring now to FIG. 17A, FIG. 17B, and FIG. 17C, using the device isolation layer 12 and the spacer pattern 36 as an etch mask, the active region 14 is etched to form a trench 40. By the spacer pattern 36, the trench 40 is spaced apart from the device isolation layer 12 to be parallel with the active region 14. A mask pattern 16 is formed on a substrate 10 including the trench 40. The mask pattern 16 has an opening 18 intersecting the active region 14. A portion of the trench 40 is exposed at the opening 18. The mask pattern 16 may comprise a material having an etch selectivity with respect to the device isolation layer 12, the spacer pattern 36, and the substrate 10. For example, the mask pattern 16 comprise silicon nitride, metallic oxide, and/or photoresist in accordance with some embodiments of the present invention. When the mask pattern 16 is made of silicon nitride, the silicon nitride has a higher etch speed than the silicon nitride of the spacer pattern 36. The etch speed of the silicon nitride may be controlled by formation speed and pressure of the silicon nitride.

Figure 18A:
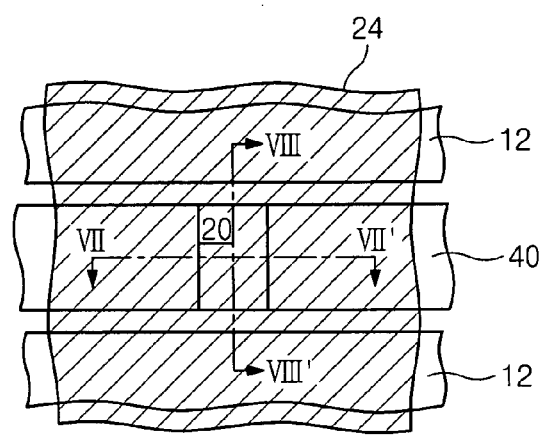
Figure 18B:
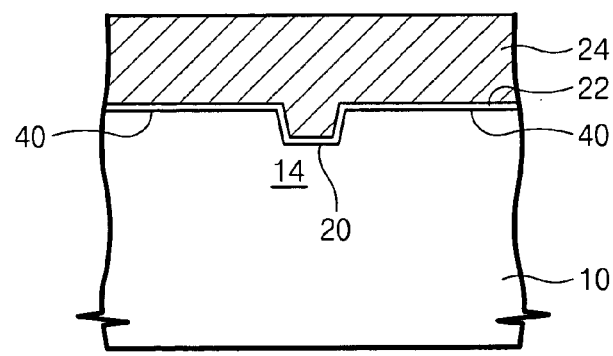
Figure 18C:
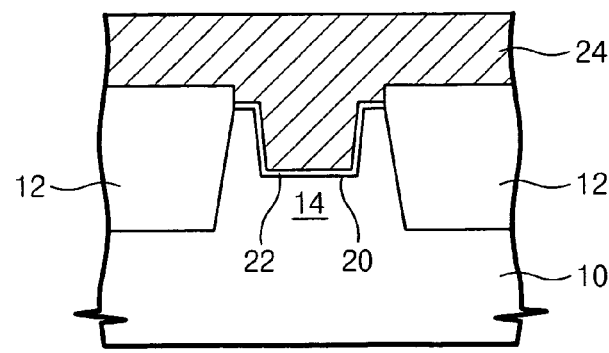

Referring now to FIG. 18A, FIG. 18B, and FIG. 18C, using the mask pattern 16, the device isolation layer 12, and the spacer pattern 36 as an etch mask, the substrate 10 is etched. The exposed trench 40 is etched to form a recess region that is deeper than the trench 40. The recess region 20 is spaced apart from the device isolation layer 12 by the spacer pattern 36. The mask pattern 16 and the spacer pattern 36 are removed to expose the active region 14. The substrate 10 is thermally oxidized to cure a defect that may occur during formation of the trench 40 and the recess region 20. The boundaries of the trench 40 and the recess region 20 may have a smooth flexure by removal of a thermal oxide layer formed by the thermal oxidation process and a cleaning process.

A gate insulation layer 22 is formed on the surface of the active region 14, and a conductive layer 24 is formed on the surface of the substrate 10. The gate insulation layer 22 may comprise silicon oxide, metallic oxide, and/or silicon oxynitride, in accordance with some embodiments of the present invention. The gate insulation layer 22 may be formed by thermal oxidation, chemical vapor deposition (CVD), and/or atomic layer deposition (ALD). A channel diffusion layer may be further formed by implanting impurities into the active region 14. The channel diffusion layer 24 may be formed before or after formation of the gate insulation layer 22. The conductive layer 24 may comprise polysilicon or polysilicon germanium. In other embodiments of the present invention, the conductive layer 24 may comprise metal (or metallic silicide) stacked on polysilicon (or polysilicon germanium).

The conductive layer 24 is patterned to form a gate pattern 24g crossing over the active region 14 as illustrated in FIG. 10A, FIG. 10B, and FIG. 10C. Using the gate pattern 24g as an ion implantation mask, a source region 26s is formed in the active region adjacent to one side of the gate pattern 24g and a drain region 26d is formed in the active region adjacent to the other side thereof. The gate pattern 24g crosses over the second trench 50 and the recess region 20. As shown in the figures, the recess region 20 may be disposed centrally below the gate pattern 24g.

As discussed above, a recess region is formed at a substrate below a gate pattern to form a channel along a surface of the recess region. The recess region is spaced apart from a device isolation layer and thus has a boundary defined by the substrate in the channel length and width directions. Therefore, the channel of a transistor is curved along the surface of the recess region in the length and width directions. For this reason, a transistor in accordance with some embodiments of the present invention may have a wider width and a longer length than a conventional transistor.

Moreover, the above-described structure may be adapted so that channel width and length are defined as needed while the 2-dimensional size of the transistor is reduced on the substrate. Therefore, it may be possible to suppress the short channel effect which generally increases according to the reduction of the transistor size and to reduce the likelihood and impact of problems such as punchthrough, increase of leakage current, and degradation of sub-threshold swing. Furthermore, current decrease caused by the reduction of the transistor size may be suppressed to provide a highly integrated high-performance device.

In concluding the detailed description, it should be noted that many variations and modifications can be made to the preferred embodiments without substantially departing from the principles of the present invention. All such variations and modifications are intended to be included herein within the scope of the present invention, as set forth in the following claims.

That which is claimed:

1. A transistor, comprising:
   a substrate;
   a device isolation layer formed on the substrate to define an active region;
   a gate pattern that crosses over the active region;
   a gate insulation layer interposed between the gate pattern and the active region;
   source and drain regions formed in the active region adjacent to respective sides of the gate pattern; and
   a channel region disposed in the active region between the source and drain regions, wherein the channel region comprises a recessed portion that is spaced apart from edges of the device isolation layer beneath the gate pattern and a width of the recessed portion is less than a width of the active region in a direction parallel with the gate pattern.

2. The transistor of claim 1, wherein a bottom portion of the gate pattern projects toward the recessed portion of the channel region.

3. The transistor of claim 1, wherein a surface of the recessed portion of the channel region is inclined.

4. A transistor comprising:
   a substrate;
   a device isolation layer formed on the substrate to define an active region;
   a gate pattern that crosses over the active region;
   a gate insulation layer interposed between the gate pattern and the active region;
   source and drain regions formed in the active region adjacent to respective sides of the gate pattern;
   a channel region disposed in the active region between the source and drain regions; and
   a recess region disposed in the active region beneath the gate pattern, the recess region being spaced apart from edges of the device isolation layer and edges of the gate pattern such that the gate pattern overlaps the recess region, wherein a width of the recess region is less than a width of the active region in a direction parallel with the gate pattern.

5. The transistor of claim 4, wherein a width of the recess region is less than a width of the active region in a direction parallel with the gate pattern and is less than a width of the gate pattern in a direction perpendicular to the gate pattern.

6. The transistor of claim 4, wherein a bottom portion of the gate pattern projects toward the recess region.

7. The transistor of claim 4, wherein a surface of the channel region is inclined along a surface of the recess region.

8. A transistor comprising:
   a substrate;
   a device isolation layer formed on the substrate to define an active region;
   a gate pattern that crosses over the active region;
   a first trench formed in the active region, the first trench being spaced apart from edges of the device isolation layer;
   a recess region formed in the first trench below the gate pattern;
   a gate insulation layer interposed between the gate pattern and the active region;
   source and drain regions formed in the active region adjacent to respective sides of the gate pattern; and
   a channel region disposed in the active region between the source and drain regions, wherein a width of the first trench is less than a width of the active region.

9. The transistor of claim 8, wherein a width of the recess region is less than a width of the active region in a direction parallel with the gate pattern and is less than a width of the gate pattern in a direction perpendicular to the gate pattern.

10. The transistor of claim 8, wherein a bottom portion of the gate pattern projects toward the recess region, and a surface of the channel region is inclined along a surface of the recess region.

11. The transistor of claim 8, further comprising a second trench formed in the active region below the gate pattern;
   wherein the recess region is formed at an intersection of the first and second trenches.

12. The transistor of claim 11, wherein a width of the first trench is less than a width of the active region, and a width of the second trench is less than a width of the gate pattern.

13. The transistor of claim 11, wherein a bottom portion of the gate pattern projects toward the recess region, and a surface of the channel region is inclined along a surface of the recess region.

* * * * *